United States Patent [19]
Katsumura et al.

[11] 3,886,581
[45] May 27, 1973

[54] DISPLAY DEVICE USING LIGHT-EMITTING SEMICONDUCTOR ELEMENTS

[75] Inventors: Hiroshi Katsumura, Tokyo; Hiroshi Fujita; Kei Kaneda, both of Kawasaki, all of Japan

[73] Assignee: Tokyo Shibaura Electric Co., Ltd., Japan

[22] Filed: Dec. 21, 1973

[21] Appl. No.: 427,216

[30] Foreign Application Priority Data

Dec. 28, 1972 Japan .................................. 48-3025

[52] U.S. Cl. ........................ 335/17; 357/45; 357/55; 357/72; 357/75

[51] Int. Cl. ............................................ H05b 33/10

[58] Field of Search ...... 317/235 N, 235 AJ, 234 G, 317/234 E, 101 CC

[56] References Cited

UNITED STATES PATENTS

| | | | |
|---|---|---|---|
| 3,573,568 | 3/1971 | Siegel | 317/234 |
| 3,636,397 | 1/1972 | Addamiano | 313/108 |
| 3,736,475 | 5/1973 | Berner | 317/234 R |
| 3,742,598 | 7/1973 | Nishida | 29/574 |
| 3,771,025 | 11/1973 | Berner | 317/234 R |
| 3,812,406 | 5/1974 | Henri | 317/235 N |

*Primary Examiner*—Martin H. Edlow
*Attorney, Agent, or Firm*—Oblon, Fisher, Spivak McClelland & Maier

[57] ABSTRACT

A display device having a plurality of light-emitting semiconductor elements arranged on an electric insulation base plate in a prescribed pattern with the respective P-N junctions positioned perpendicular to the base plate, thereby displaying numbers or characters when the semiconductor elements are selectively energized, wherein the light-emitting semiconductor elements are fixed to electric insulation adhesive layers coated on the prescribed parts of the base plate, a pair of electrodes formed on both surfaces of the respective semiconductor elements are disposed parallel to the P-N junction, and a pair of conductive adhesive layers connect electrically the electrodes to conductive layers printed on the base plate.

11 Claims, 5 Drawing Figures

DISPLAY DEVICE USING LIGHT-EMITTING SEMICONDUCTOR ELEMENTS

This invention relates to a display device provided with light-emitting semiconductor elements or light emitting diodes.

In the conventional display device using light-emitting semiconductor elements, said elements bearing a prescribed shape have one surface parallel to the P-N junction soldered to printed conductive layers and the opposite side bonded to a fine lead of aluminum connected to an external lead. Under such arrangement, the fine lead itself partly conceals light emitted from the light-emitting semiconductor element from view, apparently reducing the effect of illumination. Moreover, the uneven distribution of emitted light gives rise to irregularly bright light emitting segments representing numbers or characters. Further, the bonding of the fine lead to the electrodes of the light-emitting semiconductor elements demands high precision work and is accompanied with great difficulty.

There has recently been proposed another type of display device having a plurality of light-emitting semiconductor elements arranged on an insulation base plate with the respective P-N junctions positioned perpendicular to the base plate. In this display device, the semiconductor element is placed in a groove formed in the base plate. A pair of electrodes formed on both surfaces of the semiconductor element parallel to the P-N junction are soldered for electrical connection to conductive layers printed on the base plate and extending to the groove.

The prior art display device using light-emitting semiconductor elements has the drawbacks that during the operation of soldering together the electrodes and printed conductive layers, molten solder is likely to flow into the above-mentioned groove, causing the P type layer and N type layer to be undesirably short-circuited; the leadout of the electrodes is accompanied with difficulties; and that surface of the light-emitting semiconductor element which contacts the base plate is soiled with molten solder to decrease the illuminating effect of said element.

It is accordingly the primary object of this invention to provide a display device with light-emitting semiconductor elements which efficiently gives forth light emitted therefrom.

Another object of the invention is to provide a display device with light-emitting semiconductor elements which is so constructed as to admit of the reliable leadout of the electrodes of said semiconductor elements.

Still another object of the invention is to provide a display device with light-emitting semiconductor elements which is so constructed as to facilitate the work of leading out the electrodes of said semiconductor elements.

According to the display of this invention, a plurality of light-emitting semiconductor elements bearing a P-N junction are fixed to a base plate by an electric insulation adhesive layer with the P-N junction positioned nonparallel or substantially perpendicular to the base plate. The electrodes formed on both surfaces of the semiconductor and the conductive layers printed on the base plate are electrically connected together by a conductive adhesive layer coated on the aforesaid insulation adhesive layer.

This invention can be more fully understood from the following detailed description when taken in conjunction with the accompanying drawings, in which.

Figure 1:
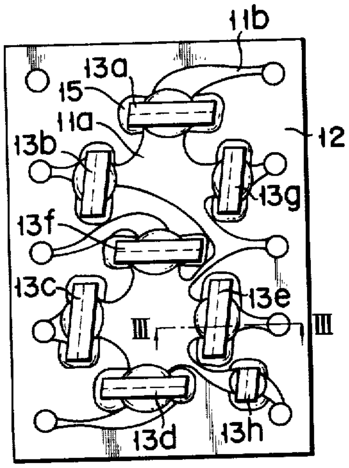
FIG. 1 is a plan view of a display device using light-emitting semiconductor elements according to an embodiment of this invention.
Figure 2:
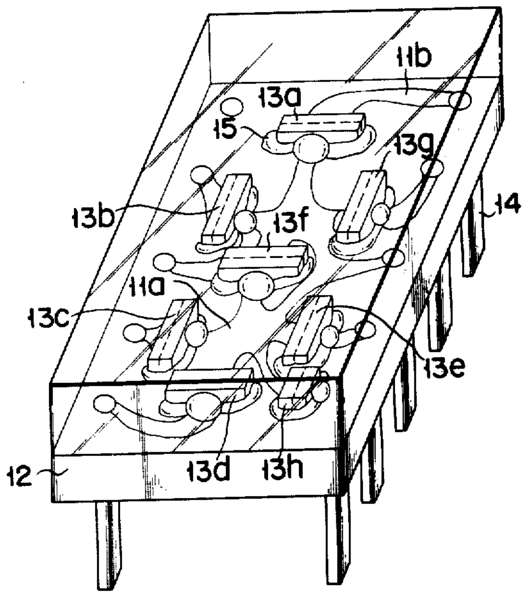
FIG. 2 is an oblique view of the display device of FIG. 1.
Figure 3:
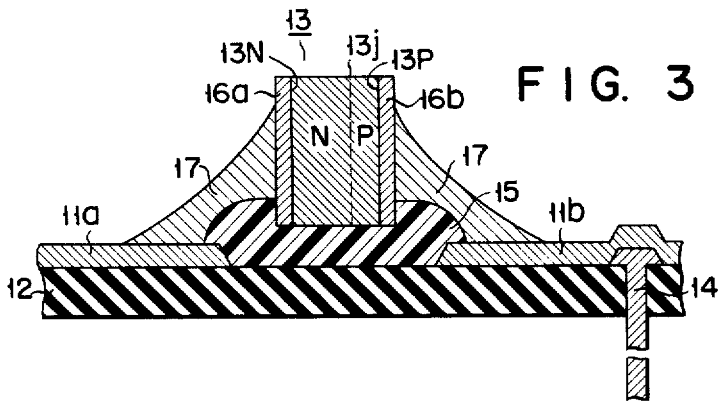
FIG. 3 is an enlarged cross sectional view of the display device along the line III—III of FIG. 1 as viewed in the direction of the indicated arrows.

There will now be described by reference to FIGS. 1 to 3 a display device according to this invention provided with a plurality of light-emitting semiconductor elements or light emitting diodes. Eight plate- or rod-like light-emitting semiconductor elements **13*a*, 13*b*, 13*c*, 13*d*, 13*e*, 13*f*, 13*g*, 13*h* are horizontally arranged in a prescribed pattern, namely, in the form of a digit 8 on the same side of a base plate 12 on which first and second conductive layers 11*a*, 11*b* are printed for power supply. Of these eight light emitting semiconductor elements, the one 13*h* is intended to indicate a decimal point. The eight semiconductor elements constituting the digit 8 are referred to as "segments," the selective illumination of which attains the display of digits from zero to 9, and also a decimal point. The base plate 12 is an electrically insulated plate formed of ceramic material. The conductive layers 11*a*, 11*b* are prepared by plating a film of gold, for example on a molybdenum-manganese layer baked to the base plate. The conductive layers 11*a*, 11*b* are connected to external leads 14. Further, said conductive layers are not formed at those parts of the base plate 12 to which the light-emitting semiconductor elements 13*a* to 13*h* are fitted, said parts being coated with an organic electric insulation adhesive by a printer to form an electric insulation adhesive layer 15. This electric insulation adhesive layer 15 consists of, for example, epoxy resin or silicone resin. Fitted to the electric insulation layer 15 is a light-emitting semiconductor element 13 prepared from gallium phosphide (GaP) in the form of a plate or rod with the P-N junction 13*j* disposed nonparallel, for example, perpendicular to the base plate 12. In this case, the semiconductor element 13 is fixed in place by the electric insulation adhesive layer 15 such that part of that side of the semiconductor element 13 on which the P-N junction is exposed is made to face the base plate 12. The semiconductor element 13 having part of the P-N junction plane covered with the electric insulation adhesive layer 15 prevents the later described conductive adhesive layer from being carried into an interstice between the base plate 12 and the semiconductor element 13 when said element 13 is fitted to the base plate 12. When formed of transparent epoxy resin, the electric insulation adhesive layer 15 is firmly fixed in place by heating of 3 hours at a temperature of 100°C. This adhesive 15 is chosen to have such viscosity as admits of easy coating by a printer. Further, it is demanded that the adhesive 15 be of the type which, when thermally set, does not have its viscosity considerably reduced nor its surface tension so decreased as to cause the adhesive itself to spread over the entire surface of the semiconductor element 13 or part of the surface of the substrate 12. Moreover, said adhesive 15** should have a small refraction index, preferably smaller than the semiconductor element 13 so as to reflect light at the boundary between the adhesive 15 and said element 13. The adhesive 15 is also desired to be sufficiently transparent to be as little absorptive as possible of emitted light and, during coating, distinctly to indicate the fitting position of the semiconductor element 13, namely, be slightly tinted with the same color as the emitted light (colored red for a red light-emitting type of GaP element and green for a green light-emitting type of GaP element).

The above-mentioned electric insulation adhesive 15 is effective to fix the semiconductor element 13 to its prescribed position on the base plate when the display device is assembled and also to prevent the exposed part of the P-N junction 13j of the semiconductor element 13 from being soiled by the spread of the conductive adhesive layer when the electrodes of the semiconductor element 13 are led out after the assembly.

The electrode 16*a* formed on the N layer surface 13N of the semiconductor element 13 and the first conductive layer 11*a*, as well as the electrode 16*b* formed on the P layer surface 13P and the second conductive layer 11*b*, are connected by a connector, for example, a conductive adhesive layer 17 extending over the electric insulation adhesive layer 15. The conductive adhesive layer 17 may consist of a paste of silver, or a metallic solder formed of a lead (Pb)-tin (Sn) alloy or a gold (Au)-tin (Sn) alloy.

Further, the light-emitting semiconductor element may be prepared from not only gallium phosphide (GaP), but also gallium arsenide (GaAs) or gallium arsenic phosphide (GaAsP). The base plate may consist of bakelite or epoxy resin in addition to ceramic material.

In the foregoing embodiment, the light-emitting semiconductor elements have such dimensions as match the segments of numbers or characters. For example, where only the semiconductor elements 13*a*, 13*g*, 13*f*, 13*e*, 13*d* are made to emit light, then a digit 3 may be indicated. One group of electrodes 16*a* of the semiconductor elements 13 are jointly connected by the first conductive layer 11*a* extending over the base plate 12 to be led out through one lead, and another group of electrodes 16*b* are connected to separate leads through the second conductive layer 11*b*.

An assembled display device is enclosed airtight in an envelope molded from transparent resin. This resin envelope acts as a filter selectively allowing the passage of a certain colored light from an illumination source, thereby effectively preventing any unnecessary external light from being reflected therefrom. Namely, said resin envelope acts, for example, as a red color filter for a red light-emitting type of GaP element.

Figure 4:
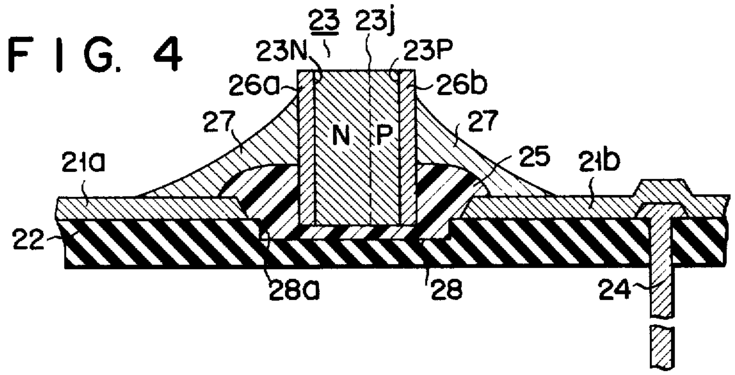
FIGS. 4 and 5 are enlarged cross sectional views of display devices according to other embodiments of the invention.

In another embodiment of FIG. 4, a groove 28 wider than the thickness of a semiconductor element 23 is formed in that part of a base plate 22 to which the semiconductor element 23 is fitted. The inner walls of the groove 28 are coated with an electric insulation adhesive which is pressed into an interstice between the side walls 28*a* of the groove 28 and the outer walls of the semiconductor element 23 when the latter is inserted into said groove 28, thereby fixing the semiconductor element 23 in place. The groove 28 also acts as a guide in fixing the semiconductor element 23 to its prescribed position when a display device is assembled, thus attaining the easy placement of said element 23. Further, the groove 28 enables the semiconductor element 23 to project from the base plate 22 to a smaller extent than in the first embodiment of FIG. 3.

Figure 5:
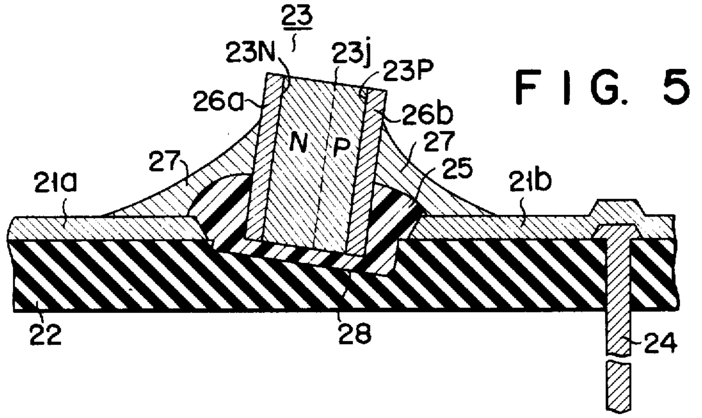

FIG. 5 illustrates a display device according to still another embodiment of this invention. The light-emitting semiconductor element 23 is fitted to the base plate 22 with the P-N junction 23*j* inclined at a predetermined angle to the base plate 22. This embodiment enables emitted light to be directed right to the view of an observer by varying the angle of inclination at which the semiconductor element 23 is fixed to the base plate 22.

The foregoing description refers to the case where a single digit was indicated. Obviously, this invention is also applicable to a display device for indicating a number of many orders, or various characters or patterns.

As mentioned above, this invention enables light emitted from light-emitting semiconductor elements to be effectively drawn out and attains the reliable and easy leadout of the electrodes of the semiconductor elements. Further, where said elements are fitted to the base plate at a proper angle of inclination to direct their illumination planes toward an observer, then numbers or characters thus displayed can be easily recognized.

What we claim is:

1. A display device comprising an insulation base plate; a plurality of light-emitting semiconductor elements arranged on the base plate in a prescribed pattern, each of said semiconductor elements having a P-N junction and electrodes formed on both surfaces so disposed as to face the P-N junction, said semiconductor elements each being disposed to the base plate with the P-N junction disposed nonparallel to the base plate; an organic electric insulation adhesive layer covering part of the exposed P-N junction plane of the semiconductor element so as to fix it to the base plate; a conductive layer printed on the base plate; and a connector laid on the electric insulation adhesive layer for electrical connection of the electrodes of the semiconductor element to the conductive layer.

2. A display device according to claim 1, wherein the semiconductor element is made of one compound selected from the group consisting of gallium phosphide (GaP), gallium arsenide (GaAs) and gallium arsenic phosphide (GaAsP).

3. A display device according to claim 1, wherein the semiconductor element is fitted to the base plate with the P-N junction disposed substantially perpendicular to the base plate.

4. A display device according to claim 1, wherein a plurality of semiconductor elements are arranged on the base plate in a prescribed pattern so as to indicate numbers or characters and bear such dimensions as substantially match the segments of the numbers or characters.

5. A display device according to claim 1, wherein the organic electric insulation adhesive layer is prepared from epoxy resin or silicone resin.

6. A display device according to claim 1, wherein the connector is a paste of silver (Ag), or a solder consisting of metal such as a lead (Pb)-tin (Sn) alloy or a gold (Au)-tin (Sn) alloy.

7. A display device according to claim 1, wherein the base plate is provided with a groove wide enough to allow the organic electric insulation adhesive material to be carried into an interstice between the side walls of the groove and the outer walls of the semiconductor element when the latter is fitted into the groove.

8. A display device comprising an insulation base plate; a plurality of light-emitting semiconductor elements arranged on the base plate in a prescribed pattern, each of said conductor elements having electrodes formed on both sides and a P-N junction disposed parallel to said both sides, said P-N junction being disposed perpendicular to the base plate and partly exposed to the outside; an organic electric insulation adhesive layer for fixing the semiconductor element to the base plate; a conductive layer printed on the base plate for power supply; and a conductive adhesive layer laid on the electric insulation adhesive layer for electrical connection of the electrodes of the semiconductor element to the conductive layer.

9. A display device according to claim 8, wherein the light-emitting semiconductor element takes the form of a plate or rod.

10. A display device according to claim 8, wherein the light-emitting semiconductor elements bear such dimensions as substantially match the segments of numbers and characters being displayed.

11. A display device according to claim 8, wherein the electric insulation adhesive layer is transparent and further tinted with the same color as an emitted light.

* * * * *